(12) United States Patent
Cehelnik

(10) Patent No.: US 7,358,742 B2
(45) Date of Patent: Apr. 15, 2008

(54) DC & AC COUPLED E-FIELD SENSOR

(76) Inventor: Thomas G. Cehelnik, 8300 E. Ocotillo Dr., Tucson, AZ (US) 85750

(*) Notice: Subject to any disclaimer, the term of this patent is extended or adjusted under 35 U.S.C. 154(b) by 0 days.

(21) Appl. No.: 11/376,026

(22) Filed: Mar. 15, 2006

(65) Prior Publication Data

US 2006/0226858 A1 Oct. 12, 2006

Related U.S. Application Data

(63) Continuation-in-part of application No. 10/978,142, filed on Oct. 29, 2004, now Pat. No. 7,242,298.

(60) Provisional application No. 60/515,844, filed on Oct. 30, 2003.

(51) Int. Cl.
*G01R 29/12* (2006.01)
*G01R 27/26* (2006.01)

(52) U.S. Cl. ...................... 324/457; 324/687

(58) Field of Classification Search .............. None
See application file for complete search history.

(56) References Cited

U.S. PATENT DOCUMENTS

| | | | |
|---|---|---|---|
| 5,570,010 A * | 10/1996 | Jin et al. ................. | 324/67 |
| 5,880,627 A * | 3/1999 | Thiel, V .................. | 327/562 |
| 6,686,800 B2 * | 2/2004 | Krupka .................. | 330/69 |
| 6,859,141 B1 * | 2/2005 | Van Schyndel et al. .... | 340/562 |
| 6,922,059 B2 * | 7/2005 | Zank et al. ............... | 324/457 |
| 6,968,171 B2 * | 11/2005 | Vanderhelm et al. ....... | 455/296 |

* cited by examiner

*Primary Examiner*—Deb Anjan
*Assistant Examiner*—Jeff Natalini
(74) *Attorney, Agent, or Firm*—Thorpe North & Western LLP

(57) ABSTRACT

A method and apparatus is shown for detecting with high sensitivity by allowing the operation of an e-field amplifier without a DC bias resistor shunt with the amplifier input. E-fields produced by an approaching body, or changing E-field of the background, turn on the amplifier from a partial DC bias state with E-field coupling to the power supply of the amplifier. The result is high sensitivity and extremely long battery life. The amplifier is sensitive to transient and quasitatic DC E-field and the AC background signals. The signals are available simultaneously for processing at the output of the amplifier in a DC and AC coupled channel. The resulting signals are passed to a control system.

14 Claims, 4 Drawing Sheets

DC & AC COUPLED E-FIELD SENSOR

CROSS REFERENCE TO RELATED APPLICATIONS

This is a continuation-in-part of application Ser. No. 10/978,142, filed Oct. 29, 2004 now U.S. Pat. No. 7,242, 298, which claimed priority based on provisional application Ser. No. 60/515,844, filed Oct. 30, 2003, and of application Ser. No. 10/772,908, filed Feb. 5, 2004, which claimed priority on provisional application Ser. No. 60/445,548, filed Feb. 6, 2003, and on provisional application Ser. No. 60/515, 844, filed Oct. 30, 2003. This application also claims priority based on provisional application Ser. No. 60/689,975, filed Jun. 6, 2005.

STATEMENT OF FEDERALLY SPONSORED RESEARCH OR DEVELOPMENT

Not applicable

REFERENCE SEQUENCE LISTING OR COMPUTER PROGRAM

Sequence listing is not applicable

FIELD OF THE INVENTION

This invention relates to an apparatus and method for detecting presence of charge and proximity of an object. The invention offers an new extremely sensitive electric field sensor applicable to in Ser. No. 10/772,908 to charge detection. The invention is a sensor with extremely sensitive electrostatic behavior to both AC and DC fields.

BACKGROUND OF THE INVENTION

The invention relates to an electric field sensor called and E-field sensor. E-fields sensors are devices shown by Cehelnik, Zank et. al, and Beatty as being capable of detecting electric fields fluctuations. These may occur from source fields caused by body stepping motion, the charging of bodies from the triboelectric effect, and changes in the background fields. Cehelnik taught about the usefulness of using the AC field of the background signals to detect a proximate body. Cehelnik has also shown the usefulness in using the correlation between the DC field and AC field signatures when a grounded body approaches an E-field sensor with a charged item in hand. Now herein this application, Cehelnik describes and claims usefulness of a sensor having extreme DC E-field sensitivity. The new sensor unexpected exhibits high DC swing voltages with a single stage amplifier and it AC coupled output exhibits the effect of drastically reducing the AC background signal due to a proximate ungrounded body. Thus the sensor provides a new correlated response between the DC E-field input and the AC output of the sensor. Sensing methods using this correlation are claimed, as well as apparatus using the new sensor design.

The correlation effect is seen for transient responses. Transient responses can be caused by the approach of a body proximate to the sensor or occur when a body or background field changes its charge with respect to time. The sensor also allows detection of static or quasistatic effects due to a body approaching the sensor and remaining stationary proximate it. These effects are also observed when the sensor is located behind materials, allowing the sensor to have a see-thru ability.

The need exist to have even more simple e-field amplifiers circuitry to facilitate miniaturization. Further reduction in complexity will facilitate the use of semiconductor deposition processes, perhaps even those used on flat screen TV and video screens. Microsensor arrays will become available by using integrated circuit manufacturing processes.

The resulting sensor arrays then will find further uses when embedded within object. Even humans bodies may have embedded sensors such as in the brain or other tissues. These embedded sensors will detect local changes in electric fields due to a variety of mechanisms such a nerve responses or electric response, thus allowing for high resolution E-field imaging.

Further simplified and more sensitive sensors will find usefulness in the systems as described by the author's previous applications, such as in human machine interfaces, imaging, and security systems.

APPROACH

The invention achieves extreme E-field sensitivity to changing electric. This is found due to the high input impedance of a JFET type junction used in operational amplifiers and some discrete components. For example the TL082 has an input impedance of order $10^{12}$ Ohms, and even other exist with higher input impedance. The trouble is these amplifiers require some flow of current from their inputs to bias the amplifiers properly or they will saturate or in other words have a large DC offset. An E-field sensor picks up an E-field with an electrode attached to the input of the amplifier. To date sensor amplifier designs use a shunt resistor to allow for DC bias of the operational amplifiers.

Zank et. al. shows the importance in increasing the impedance of the shunt resistor. Cehelnik shows the usefulness of the filtering effect of the resistor and shunt capacitances.

Herein it we show the elimination of the bias resistor results in some unexpected and useful results of high DC sensitivity. Even further advantages are obtained when there is electrical coupling between the opamp E-field input and the voltage supply rail of the amplifier.

KEY FEATURES OF INVENTION

A key capability of the invention is have extremely high input impedance of the amplifier by allowing the DC signal output of the amplifier to have a bias even toward saturation, say the negative voltage rail of the TL082. This amplifier in this mode is partial turned on and amplifies small AC signals that ride on the bias, but is not operational in the usual sense. It therefore also draws very little power when in this state. This operation mode is in contrast to conventional operation.

Another key feature of the invention is the amplifier has electrical coupling between the E-field input to the amplifier and a voltage rail.

The said coupling causes the amplifier to turn on with the approach of a body or changes in the E-field, because during the event the coupling causes the amplifier to turn on.

Yet another key feature of the invention is there are two outputs, a DC coupled output of the amplifier, and another that is AC coupled. Each of these output are coupled to optional filter for shaping of the responses.

Another feature sensor input is an antenna coupled through an impedances network to the positive input in a buffer amplifier. In particular a series capacitor is used, that reduces the capacitance of the antenna, prevents DC burnout of the amplifier, and forms a high pass filter between the antenna and the internal input impedance of the amplifier. It is conceivable that other coupling networks will also find usefulness by others in the art and are also covered in this invention.

However, FIG. 1 shows that there is a pickup electrode that couples the E-field signal through an impedance to the negative voltage supply. The coupling is shown to be through the air and the stray impedances of the wiring circuit.

BRIEF DESCRIPTION OF DRAWINGS

The invention will be better understood upon reading the following Detailed Description while referencing the provided drawings.

DETAILED DESCRIPTION OF THE INVENTION

Figure 1:
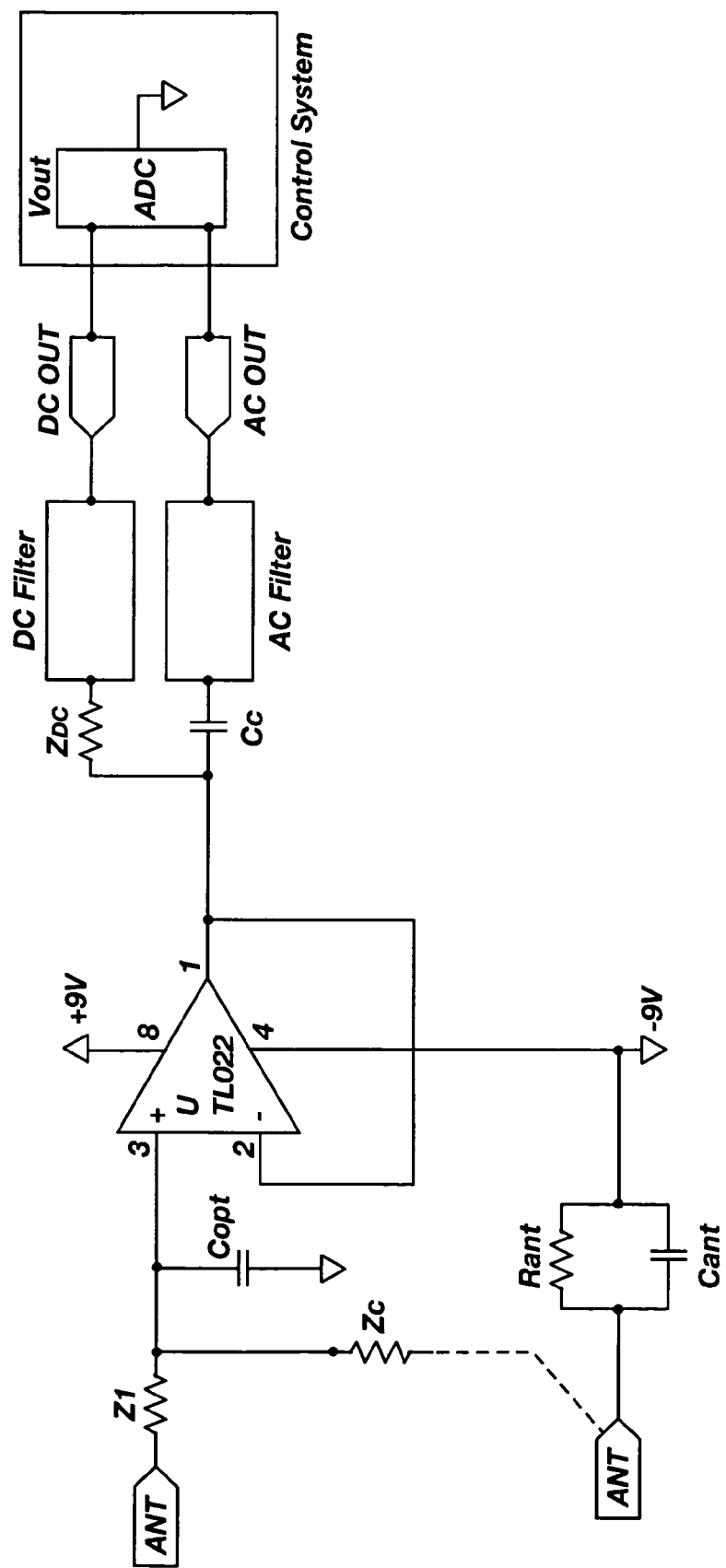
FIG. 1 shows a schematic of the E-field sensor having electrode coupling and AC and DC coupled outputs.

The amplifier shown in FIG. 1 indicates a unity gain amplifier with an antenna. The gain is sufficient to have DC voltages swings from supply voltage rail to rail due to E-field transients in the DC field.

The antenna in this case is about 18" long alligator clip with 4" of hookup wire that is wrapped in a spiral to conserve space. A circuit trace on a circuit board will also work fine for sensors in production. Depending upon application the antenna may be extended in lines such as to make an array, or compress in some other form. Generally, though the longer the antenna the more signal input to the sensor, but also the impedance changes too. These two effects make it then useful to have a coupling circuit such as a series capacitor to reduce effect sensor capacitance and prevent DC burnout. Note the large length of antenna is contradictory to Zank et. al findings and thus the disclosed device is different.

The antenna is long so its voltage pickup is at substantial signal level and we series coupled it through the impedance Z1 to the input of the amplifier. The impedance used in our prototype was a capacitor of value 0.02 nF of the type tantalum. This was because this was the estimated capacitance of the antenna, and thus we could reduce the capacitance in half with the series capacitor. The value of the impedance and type is adjustable to allow the tailoring of the impulse response of the sensor.

FIG. 1 shows the antenna is a complex impedance network that can be thought of as a parallel resistor and capacitor connected with a series impedance not shown. In the general case, not shown we can have these elements replaced by impedances, but it is not shown that way for clarity, but any such arrangement of impedance is covered in this invention.

The sensor in its idle state has an output voltage near the negative voltage rail around −8 volts, but still allows for a 2 volt peak to peak AC signal from the 60 Hz background to ride on the DC in an unclipped state.

The parallel coupling from the input is two-fold. FIG. 1 shows Copt as a voltage dividing capacitance. By placing impedances in parallel with the input the voltage to the amplifier is divided and the sensitivity is reduced. However, Cehelnik has shown that in some circumstances the filtering may be desired to improve the response of the circuit to low frequencies, or cause the sensor response to decrease due to the approach of a grounded body.

Thus our circuit can even have a shunt impedance $Z_F$ for filtering. It may be a resistor shunt with the input having a value something like 10 MOhm or 20 MOhm, or a value sufficient to cause the amplifier to have a DC offset at its output. Such a resistor reduces the voltage sensitivity as well; but may have use in filtering the signal in conjunction with other circuit impedances Z1, Copt, Zc, and the impedance of the antenna and electrodes. The amplifier saturation occurs because insufficient bias currents are flowing from the inputs to common because the input impedance is so high. It is common to believe that such an amplifier operating in this state is due to inappropriate design and deemed useless since the output is already near the DC rail voltage level.

FIG. 1 shows the impedance Zc coupling the amplifier input from the antenna to the minus voltage rail through another antenna. The coupling is achieved through the impedance air dielectric and circuit wiring. An electrode of about 4" in length is physically placed at the −V supply pin the amplifier. The electrode coupling is achieved by running it parallel to the amplifier input wire coming from the antenna prior to the coupling capacitor.

The output of the DC signal is seen at the DC coupled output where it can further be filtered to customize the response time constant to a transient DC response. These may be through high pass, low pass, and bandpass filters in the DC chain shown in FIG. 1. The DC response indicates a hand wave or pulse, the approach of a body, or from the moving of charge to create an E-field transient. If a body is grounded the DC effect is not seen.

In some cases it is desirable to insolate the sensor from having contact with the body that may carry electricity. This is not a problem because an embedded sensor in a body may be insolated by a covering. As Cehelnik has shown, the E-field response is still available through materials. Thus the sensor can be embedded in the body of a human or animal and monitor the electric state of tissues.

The AC output path allows the AC signals due to the background to pass. A bandpass filter is used in the AC filter block the coupling capacitor shown in FIG. 1 is actually a part of the filter, but is shown separated to indicate AC coupling. It is constructed from a high pass filter with series capacitance C=0.088 microFarads and shut resistance R=68 kOhm, followed by a low pass filter formed with series resistance R=68 kOhms, and shunt capacitance C=0.044 uF.

The surprising and unexpected result is the AC signal amplitude decreases with the approach of a body dramatically with high sensitivity due to the amplifiers sensitivity to the DC transient field. This occurs to a major extent when the body is not grounded, and there is a large DC input swing to the amplifier.

The A.C. amplitude also decreases because of the approach of a grounded body. This is because of the shunt capacitance Copt as described by Cehelnik in previous references.

The first AC decrease effect is surprisingly large. It is plausible that we see the nonlinearity of the input capacitance of the opamp changing with DC input voltage. This effect is an exacerbated for our case because of the high input impedance of the JFET opamps when there is no bias resistor or the bias impedance is large enough to improperly bias the amplifier thus resulting in saturation. Such an effect has been overlook by other researchers in the past because it was obscured by the DC signal and suppressed by using a bias resistor at the input, and not having the power supply electrode. This surprising and unexpected result make for a useful method of examining the AC output decrease of the background as an indicator of the E-field signal at input to the sensor. It does not happen in the same way for a grounded body, as there is no large DC input signal to cause the corresponding decrease in AC background.

Figure 2:
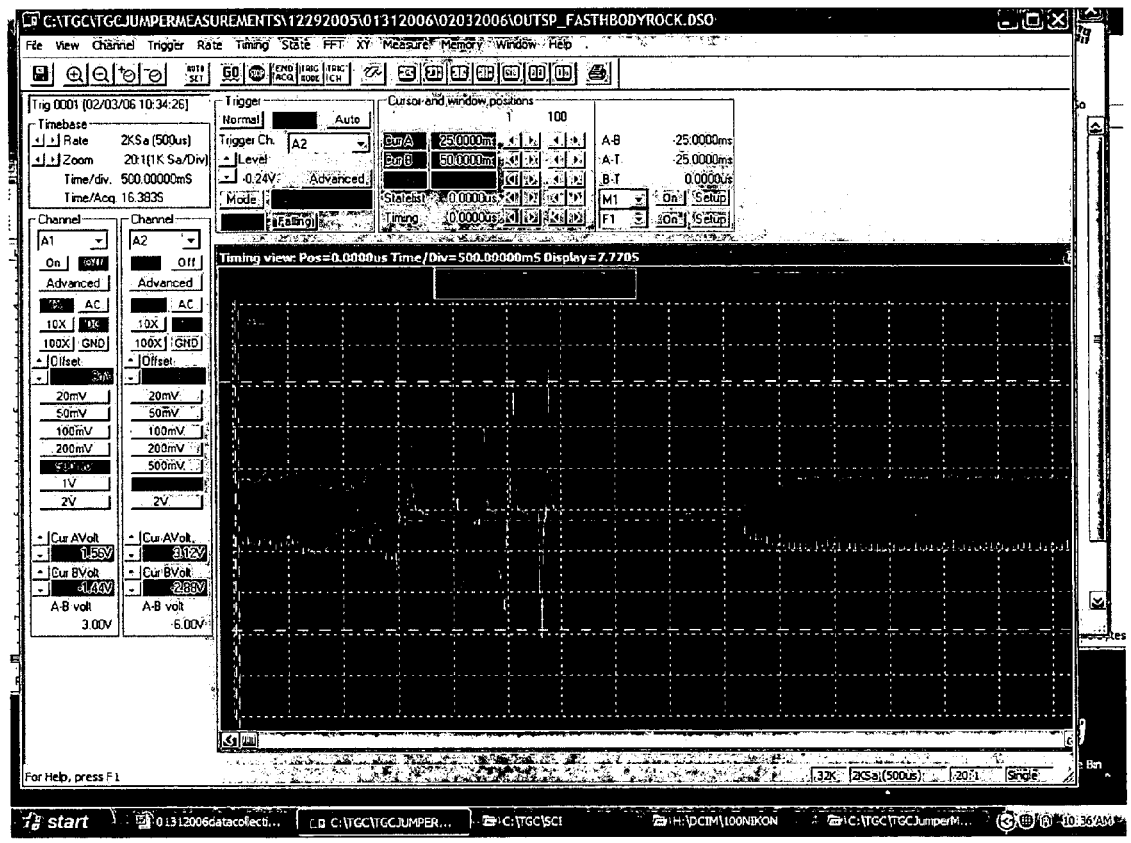
FIG. 2 shows the decrease in the AC background signal as a body moves proximate sensor and the DC transients resulting from rocking toward away from the sensor.

FIG. 2 shows this AC effect due to the DC input level where the background signal is the 60 Hz level of about 4 Vpp. The presence of the ungrounded body E-field due to the charge on a body, when the body is just a couple feet from the sensor resulted in nearly zero volt background signal during the data collection. The DC signal causes the AC signal to decrease in amplitude. FIG. 2 shows an oscilloscope trace of the AC coupled bandpass filtered 60 Hz signal from the background when a body rocks while sitting in front of the sensor on the table.

The decrease in AC signal with DC increase is also seen for each footstep. We were able to see this easily up to 15 feet away. Since the body was far, the AC signal was not pushed near zero volts by the DC E-field of the body for the collection; but is seen to cause the decrease due to the DC signal spikes from the E-field changes caused by the footsteps. This is seen if we expand the trace of the transient signal.

When a grounded body approaches, the AC amplitude of the background signal also decreases at this output as described by Cehelnik in the references. The AC signal also sees a transient from the DC transient.

Figure 3:
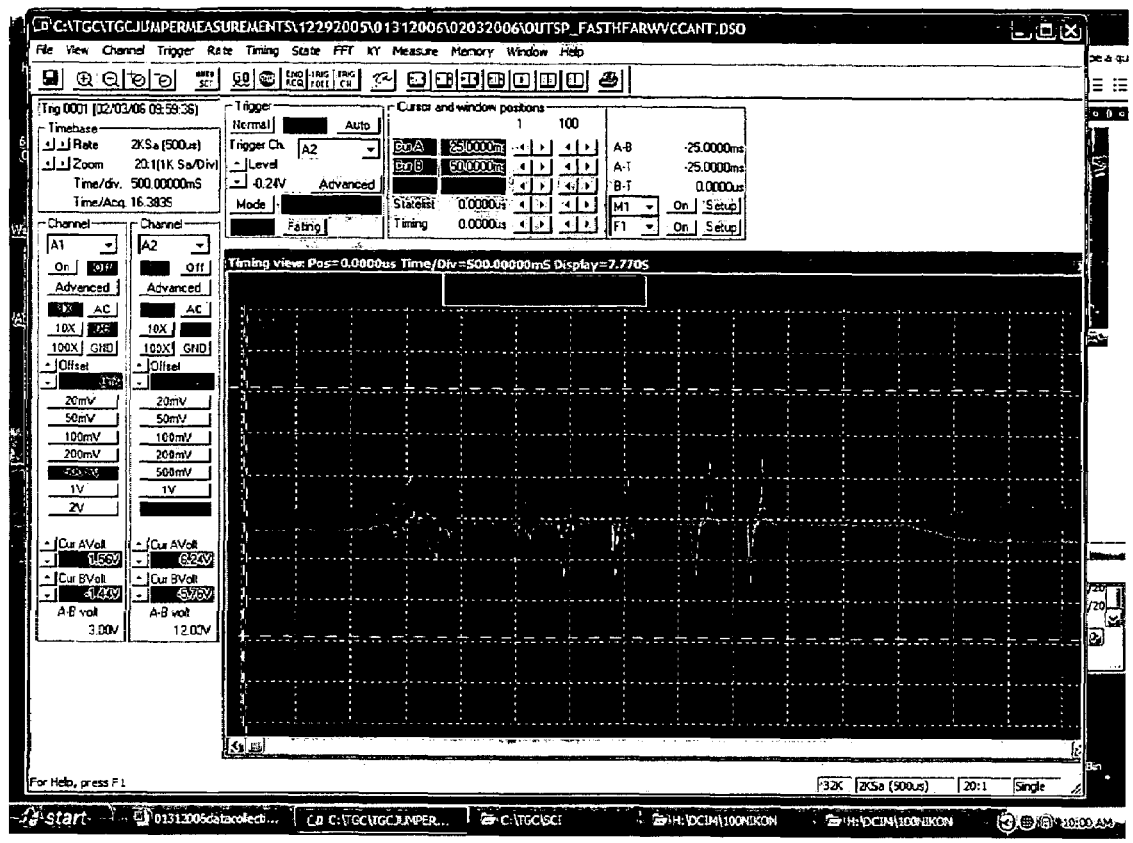
FIG. 3 shows fast hand pulses recorded at the A.C. output channel in rhythm pattern of 2-3-2 while hand moves closes to − V power supply electrode in each pulse group. This exhibits the sharpening of the transient response as the E-field coupling to the power supply electrode increases.

FIG. 3 shows the AC output of A hand-pulse pattern with a 2-3-2 rhythm pattern was performed and each pulse group during the sequence was done closer to the electrode on the negative DC voltage supply. This resulted in sharper transient response spikes as seen in FIG. 3.

Figure 4:
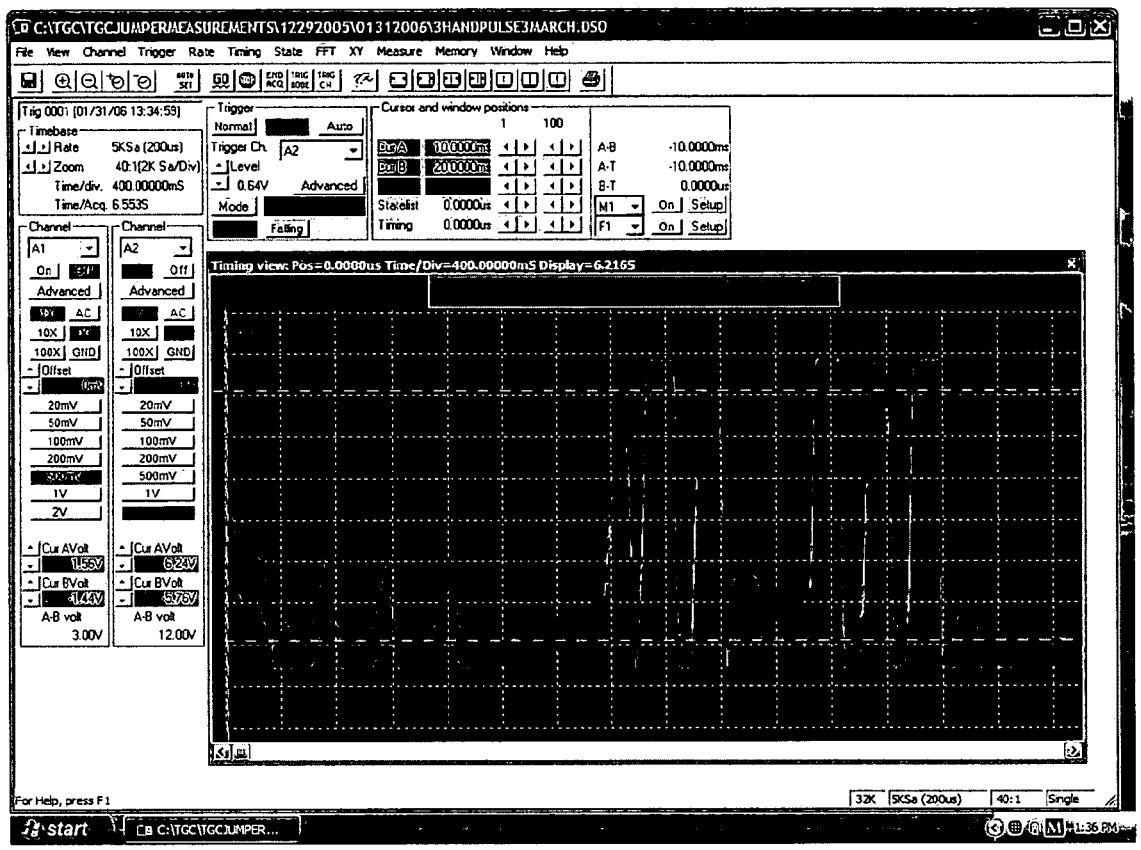
FIG. 4 shows 3 hand pulses followed by 3-3 foot marches on the DC output channel.

The DC response of the amplifier is shown in FIG. 4. FIG. 4 shows 3 hand pulses followed by 3-3 foot marches on the DC output channel. We note the pulses move positive in voltage as well as the foot steps, and return back to the biased position. The voltage swing is about −9 to +9 volts per step. The signals are cleaner in response with the − V electrode.

The DC response of amplifier is indeed sensitive. The use of the electrode on the negative voltage supply tends to make the bias move more positive and turns on the amplifier during the transient. Removing the power supply electrode and hence the coupling greatly reduces or eliminates the decrease in the AC with approach of the ungrounded body. The effect of the electrode coupling helps sharpen the time response of the sensor, and helps make the DC response more symmetric about zero volts.

The output of the sensor can be used to determine the charge state of a body or whether it is grounded or not. This is useful as an electrostatic charge sensor on a body. Depending upon the use, either or both outputs, DC or AC, can be feed into a control system. The control system may be analog circuitry such as a comparator, or the signals may be captured in and analog to digital converter (ADC) as shown in FIG. 1 and digitally processed.

The invention claimed is:

1. An E-field sensor comprising:
    an E-field sensing antenna;
    a high input impedance amplifier having an input signal input, and an output signal output;
    means coupling the E-field sensing antenna to the input signal input to supply an input signal from the E-field sensing antenna to the input signal input while substantially limiting any bias current flow at the input signal input to thereby tend to create a DC offset in an output signal at the output signal output of the amplifier; and
    means for establishing a substantially DC reference signal coupled to the input signal from the E-field sensing antenna to produce a desired DC level on the input signal which affects operation of the amplifier to modify the DC offset in the output signal.

2. An E-field sensor according to claim 1, wherein the amplifier has a DC rail power input, and the reference signal is generated by the DC rail power input.

3. An E-field sensor according to claim 1, additionally including an input signal impedance network coupling the E-field sensing antenna to the amplifier input signal input to pass the input signal from the E-field sensing antenna to the amplifier input signal input and to shape the input signal passing to the input signal input.

4. An E-field sensor according to claim 3, wherein the combination of the E-field sensing antenna and the input signal impedance network forms a filter for the input signal to the amplifier.

5. An E-field sensor according to claim 4, wherein the filter is chosen from the group of filters comprising a high pass filter, a low pass filter, and a band pass filter.

6. An E-field sensor according to claim 3, wherein the E-field sensing antenna has an effective capacitance, and wherein the input signal impedance network includes a capacitor connected in series between the E-field sensing antenna and the amplifier input signal input to reduce the effective capacitance of the E-field sensing antenna.

7. An E-field sensor according to claim 1, additionally including a DC output circuit coupled to the amplifier output signal output to produce a DC output signal indicative of DC components of the input signal.

8. An E-field sensor according to claim 7, additionally including an AC output circuit coupled to the amplifier output signal output to produce an AC output signal indicative of AC components of the input signal.

9. An E-field sensor according to claim 1, additionally including an AC output circuit coupled to the amplifier output signal output to produce an AC output signal indicative of AC components of the input signal.

10. An E-field sensor according to claim 1, wherein the high input impedance amplifier is an integrated circuit operational amplifier.

11. An E-field sensor according to claim 10, wherein the operational amplifier is constructed using JFET type junctions.

12. An E-field sensor according to claim 10, wherein the operational amplifier includes a positive input and a negative input, and wherein the input signal input is the positive operational amplifier input and the output of the operational amplifier is connected as feedback to the negative operational amplifier input.

13. An E-field sensor comprising:
    an E-field sensing antenna;
    a high input impedance amplifier having an input signal input, and an output signal output;
    means coupling the E-field sensing antenna to the input signal input to supply an input signal from the E-field sensing antenna to the input signal input while substantially limiting any bias current flow at the input signal input to thereby tend to create a DC offset in an output signal at the output signal output of the amplifier; and means for establishing a reference signal coupled to the input signal from the E-field sensing antenna that will affect the input signal in a predetermined way to affect operation of the amplifier, wherein the means for establishing a reference signal includes a reference antenna, and a reference signal source for producing a reference signal on the reference antenna, wherein the reference antenna and the E-field sensor antenna are configured and positioned with respect to one another to provide electrical coupling wherein the reference signal will affect the input signal; and wherein the reference signal is a substantially DC voltage level which creates a substantially DC voltage level on the reference antenna to adjust the DC level of the input signal to the amplifier and affect the operation of the amplifier to modify the DC offset of the output signal.

14. An E-field sensor according to claim 13, wherein the amplifier has a negative DC voltage supply rail, and the reference antenna is coupled to the negative DC voltage supply rail as the reference signal source.

* * * * *